US008289497B2

(12) United States Patent
Poon et al.

(10) Patent No.: US 8,289,497 B2
(45) Date of Patent: Oct. 16, 2012

(54) APPARATUS AND METHODS FOR RECOVERING FLUID IN IMMERSION LITHOGRAPHY

(75) Inventors: Alex Ka Tim Poon, San Ramon, CA (US); Leonard Wai Fung Kho, San Francisco, CA (US); Derek Coon, Redwood City, CA (US); Gaurav Keswani, Fremont, CA (US)

(73) Assignee: Nikon Corporation, Tokyo (JP)

( * ) Notice: Subject to any disclaimer, the term of this patent is extended or adjusted under 35 U.S.C. 154(b) by 426 days.

(21) Appl. No.: 12/379,419

(22) Filed: Feb. 20, 2009

(65) Prior Publication Data
US 2009/0237631 A1 Sep. 24, 2009

Related U.S. Application Data

(60) Provisional application No. 61/193,538, filed on Dec. 5, 2008, provisional application No. 61/064,646, filed on Mar. 18, 2008.

(51) Int. Cl.
*G03B 27/52* (2006.01)
(52) U.S. Cl. .................. 355/30; 355/67; 355/72; 355/73
(58) Field of Classification Search .................. 355/30, 355/50, 53, 67, 72, 73
See application file for complete search history.

(56) References Cited

U.S. PATENT DOCUMENTS

| 4,509,852 | A | 4/1985 | Tabarelli et al. |
| 7,251,017 | B2 | 7/2007 | Novak et al. |
| 7,751,026 | B2 * | 7/2010 | Poon et al. ........................ 355/30 |
| 8,134,685 | B2 | 3/2012 | Nishii et al. |
| 2005/0233081 | A1 * | 10/2005 | Tokita ........................ 427/256 |
| 2006/0038968 | A1 | 2/2006 | Kemper et al. |
| 2006/0087630 | A1 * | 4/2006 | Kemper et al. .................. 355/30 |
| 2006/0152697 | A1 | 7/2006 | Poon et al. |
| 2006/0232756 | A1 * | 10/2006 | Lof et al. ........................ 355/53 |
| 2007/0046910 | A1 * | 3/2007 | Poon et al. ........................ 355/30 |
| 2007/0109513 | A1 | 5/2007 | Antonius Leenders et al. |
| 2007/0110213 | A1 * | 5/2007 | Leenders et al. ................. 378/34 |
| 2007/0222967 | A1 | 9/2007 | Poon et al. |
| 2007/0291241 | A1 * | 12/2007 | Sakai et al. ...................... 355/53 |
| 2008/0002169 | A1 * | 1/2008 | Hasegawa et al. .............. 355/53 |
| 2008/0043211 | A1 | 2/2008 | Poon et al. |
| 2008/0225246 | A1 | 9/2008 | Poon et al. |
| 2008/0231822 | A1 | 9/2008 | Poon et al. |
| 2008/0231823 | A1 | 9/2008 | Poon et al. |
| 2008/0284991 | A1 | 11/2008 | Nishii |
| 2009/0231560 | A1 | 9/2009 | Poon et al. |
| 2010/0231876 | A1 * | 9/2010 | Poon et al. ........................ 355/30 |

FOREIGN PATENT DOCUMENTS

WO WO 2007/046523 A1 4/2007
* cited by examiner

*Primary Examiner* — Thomas R Artman
(74) *Attorney, Agent, or Firm* — Oliff & Berridge, PLC (57) ABSTRACT

An immersion lithography apparatus includes a projection system having a final optical element, a movable stage that is movable below the projection system such that a gap exists between the final optical element and a surface of the stage, an immersion liquid being filled in the gap, a liquid confinement member and a liquid diverter. The liquid confinement member maintains the immersion liquid in the gap, and includes a liquid recovery portion that faces the stage surface and recovers liquid from the gap. The liquid recovery portion includes a first porous portion through which a first suction force is applied and a second porous portion through which a second suction force less than the first suction force is applied, the second portion being located outward of the first portion. The liquid diverter is positioned between the stage and at least the first porous portion.

36 Claims, 8 Drawing Sheets

APPARATUS AND METHODS FOR RECOVERING FLUID IN IMMERSION LITHOGRAPHY

CROSS-REFERENCE TO RELATED APPLICATIONS

This application claims the benefit of U.S. Provisional Patent Application No. 61/064,646 filed Mar. 18, 2008 and U.S. Provisional Patent Application No. 61/193,538 filed Dec. 5, 2008. The disclosure of each of these applications is incorporated herein by reference in its entirety.

BACKGROUND

The invention relates to immersion lithography apparatus and methods, and particularly to apparatus and methods for recovering immersion fluid.

A typical lithography apparatus includes a radiation source, a projection optical system and a substrate stage to support and move a substrate to be imaged. A radiation-sensitive material, such as a resist, is coated onto the substrate surface before the substrate is placed on the substrate stage. During operation, radiation energy from the radiation source is used to project an image defined by an imaging element through the projection optical system onto the substrate. The projection optical system typically includes a plurality of lenses. The lens or optical element closest to the substrate can be referred to as the last or final optical element.

The projection area during exposure is typically much smaller than the surface of the substrate. The substrate therefore is moved relative to the projection optical system in order to pattern the entire surface of the substrate. In the semiconductor industry, two types of lithography apparatus are commonly used. With so-called "step-and-repeat" apparatus, the entire image pattern is projected at one moment in a single exposure onto a target area of the substrate. After the exposure, the substrate is moved or "stepped" in the X and/or Y direction(s) and a new target area is exposed. This step-and-repeat process is performed multiple times until the entire substrate surface is exposed. With scanning type lithography apparatus, the target area is exposed in a continuous or "scanning" motion. For example, when the image is projected by transmitting light through a reticle or mask, the reticle or mask is moved in one direction while the substrate is moved in either the same or the opposite direction during exposure of one target area. The substrate is then moved in the X and/or Y direction(s) to the next scanned target area. The process is repeated until all of the desired target areas on the substrate have been exposed.

Lithography apparatus are typically used to image or pattern semiconductor wafers and flat panel displays. The word "substrate" as used herein is intended to generically mean any workpiece that can be patterned including, but not limited to, semiconductor wafers and flat panel displays.

Immersion lithography is a technique that can enhance the resolution of lithography exposure apparatus by permitting exposure to take place with a numerical aperture (NA) that is greater than the NA that can be achieved in conventional "dry" lithography exposure apparatus having a similar optical system. By filling the space between the final optical element of the projection system and the resist-coated substrate, immersion lithography permits exposure with light that would otherwise be internally reflected at the optic-air interface. Numerical apertures as high as the index of the immersion fluid (or of the resist or lens material, whichever is least) are possible in immersion lithography systems. Liquid immersion also increases the substrate depth-of-focus, that is, the tolerable error in the vertical position of the substrate, by the index of the immersion fluid compared to a dry system having the same numerical aperture. Immersion lithography thus can provide resolution enhancement without actually decreasing the exposure light wavelength. Thus, unlike a shift in the exposure light wavelength, the use of immersion would not require the development of new light sources, optical materials (for the illumination and projection systems) or coatings, and can allow the use of the same or similar resists as conventional "dry" lithography at the same wavelength. In an immersion system in which only the final optical element of the projection system and its housing and the substrate (and perhaps portions of the stage as well) are in contact with the immersion fluid, much of the technology and design developed for dry lithography can carry over directly to immersion lithography.

However, because the substrate moves rapidly in a typical lithography system, the immersion liquid in the immersion area including the space between the projection system and the substrate tends to be carried away from the immersion area. If the immersion liquid escapes from the immersion area, that liquid can interfere with operation of other components of the lithography system. One way to recover the immersion liquid and prevent the immersion liquid from contaminating the immersion lithography system is described in US2006/0152697 A1, the disclosure of which is incorporated herein by reference in its entirety.

It also is known to maintain the immersion liquid in the gap between the last optical element and the imaging surface of the substrate by submerging both in the immersion liquid. For an example of such a system, see, for example, U.S. Pat. No. 4,509,852, the disclosure of which is incorporated herein by reference in its entirety.

In addition, U.S. patent application Ser. No. 12/073,783 (published as US2008/0231822) discloses one or more liquid diverter plates disposed between a liquid confinement member and a substrate disposed on a substrate table in order to help reduce the escape of immersion liquid. The diverter plates are disposed between a porous member of a liquid recovery portion of the liquid confinement member and the substrate.

US2007/0110213 discloses a plate disposed on a barrier member that confines a liquid between the projection system and the substrate. The plate separates the liquid-filled space between the barrier member and the substrate into upper and lower channels, such that a meniscus is formed in each of the channels.

SUMMARY

According to a first aspect of the invention, a liquid diverter is positioned between the stage (and/or the substrate held by the stage) and a first porous portion of a liquid recovery portion that is provided on a liquid confinement member. The first porous portion applies a first suction force which is higher than a second suction force that is applied by a second porous portion also provided on the liquid confinement member. The liquid diverter thus directs immersion liquid to the first porous portion to improve recovery of the liquid by that first porous portion.

The liquid diverter can be formed from one or more plates. The liquid diverter can be a single plate having an opening that surrounds an optical axis of a projection system that forms an image onto the substrate. Alternatively, the liquid diverter could include a plurality of plates that collectively define an opening that surrounds the optical axis. The one or more liquid diverter plates can be angled to direct liquid toward the first porous portion or can be disposed parallel to the substrate and a lower surface of the first porous portion. The liquid diverter also could include a series of concentric plates.

The liquid confinement member maintains the immersion liquid in the gap formed between the surface of the substrate and/or stage and the final optical element. The liquid confinement member includes a liquid recovery portion that faces the surface of the substrate and/or stage and recovers liquid from the gap. The liquid recovery portion includes the first and second porous portions. The second porous portion, which applies the second, weaker suction force, preferably is located farther away from the optical axis of the projection system than is the first porous portion.

According to some embodiments, the first and second porous portions are spaced from each other in a direction extending away from the optical axis, and separate fluid recovery chambers are provided for each of the first and second porous portions. That is, the first porous portion can be provided to cover a first fluid recovery chamber, and the second porous portion can be provided to cover a second fluid recovery chamber that is separate from the first fluid recovery chamber. According to some embodiments, a first vacuum pressure is applied to the first fluid recovery chamber, and a second vacuum pressure, weaker than the first vacuum pressure, is applied to the second fluid recovery chamber. Alternatively, the same vacuum pressure can be applied to each of the first and second fluid recovery chambers, and the first and second porous portions can be configured such that different suction forces will be applied through the porous portions to the liquid disposed below the porous portions. For example, the first and second porous portions can differ in at least one of pore size, thickness and porosity so that a stronger suction force is applied through the first porous portion than through the second porous portion.

According to some embodiments, the first and second porous portions abut each other and cover the same fluid recovery chamber. According to this embodiment, the first and second porous portions differ, for example, in at least one of pore size, thickness and porosity so that a stronger suction force is applied through the first porous portion than through the second porous portion.

The second porous portion can protrude from the lower surface of the liquid confinement member, and the liquid diverter can project inwardly toward the projection system optical axis from the lower surface of the second porous portion so as to extend over the first portion. This arrangement helps to prevent liquid from flowing outward beyond the liquid diverter.

According to other aspects of the invention, the liquid confinement member includes a non-fluid recovery portion that surrounds an aperture of the liquid confinement member. The non-fluid recovery portion is disposed between the aperture and the liquid recovery portion with respect to a direction extending away from the optical axis of the projection system. A first distance between the surface of the stage and/or substrate and a surface of the non-fluid recovery portion is less than a second distance between the surface of the stage and/or substrate and a surface of the liquid recovery portion. The non-fluid recovery portion thus is capable of functioning as a "choke plate" to assist in maintaining the immersion liquid beneath the non-fluid recovery portion and in the immersion area through which the pattern of the image is projected.

According to some embodiments, an outer portion of the non-fluid recovery portion (that is, a portion located farthest from the projection system optical axis) is tapered.

According to other embodiments of the invention, the non-fluid recovery portion has a first inner portion and a second outer portion, with a surface of the first inner portion located a first distance from the surface of the stage and/or substrate and a surface of the second outer portion being located farther than the first distance from the surface of the stage and/or substrate. The transition between the inner portion and the outer portion of the non-fluid recovery portion can be a step or can be a taper.

BRIEF DESCRIPTION OF THE DRAWINGS

The invention will be described in conjunction with the following drawings of exemplary embodiments in which like reference numerals designate like elements, and in which.

DETAILED DESCRIPTION OF EMBODIMENTS

Figure 1:
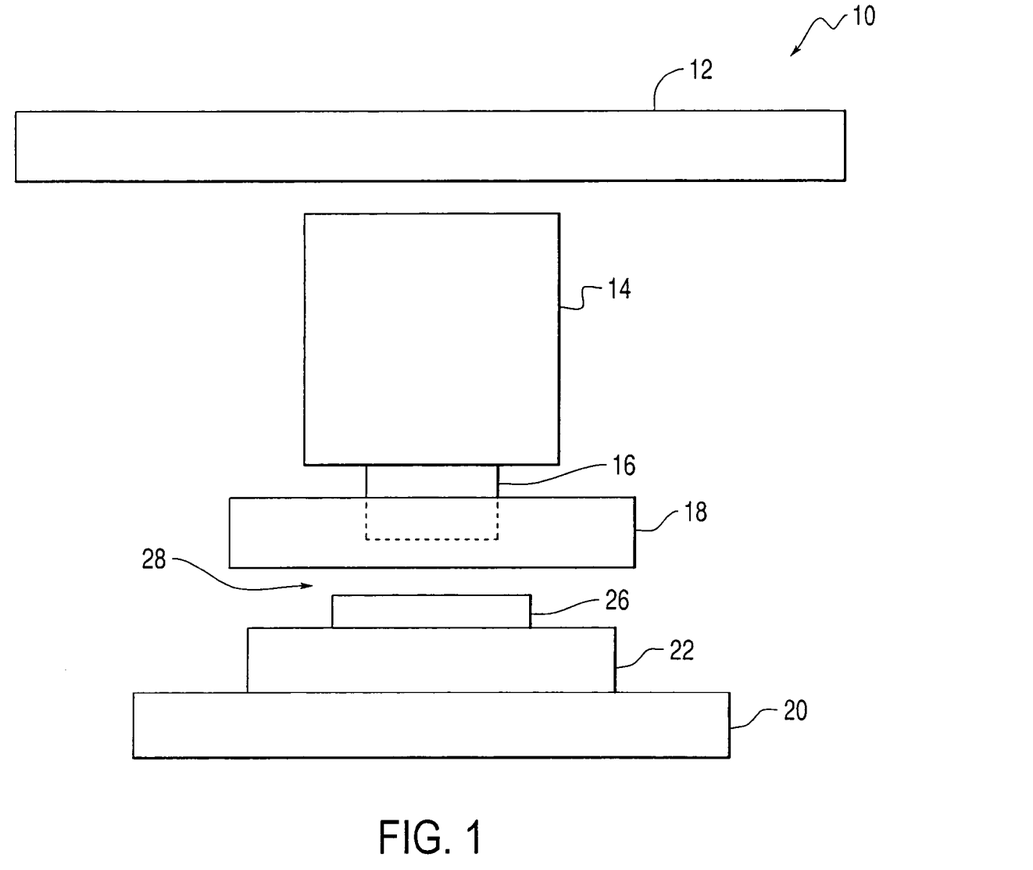
FIG. 1 is a simplified elevational view schematically illustrating an immersion lithography system according to some embodiments of the invention.

FIG. 1 shows an immersion lithography system 10 including a reticle stage 12 on which a reticle is supported, a projection system 14 having a last or "final" optical element 16, and a fine-movement stage 22 on which a substrate 26 is supported, which in turn is movable over a coarse-movement stage 20. An immersion liquid supply and recovery apparatus 18, which is sometimes referred to herein as a liquid confinement member 18, is disposed around the final optical element 16 of the projection system 14 so as to supply and recover an immersion fluid, which may be a liquid such as, for example, water, to/from a gap 28 between the final optical element 16 and the substrate 26. In the present embodiment, the immersion lithography system 10 is a scanning lithography system in which the reticle and the substrate 26 are moved synchronously in respective scanning directions during a scanning exposure operation. The fine-movement stage 22 controls the position of the substrate 26 in one or more (preferably all) of the X, Y, Z, $\ominus$X, $\ominus$Y and $\ominus$Z directions with a higher degree of precision than the coarse-movement stage 20, which is primarily used for moving the substrate 26 over longer distances, as is well known in the art. The upper surface of the fine movement stage 22 includes a substrate holder that preferably has a recess that holds the substrate 26, and a portion that surrounds the held substrate has an upper surface that is substantially level with the upper surface of the held substrate so that when the immersion area is located near the edge of the substrate, liquid is still maintained between the liquid confinement member 18 and the upper surfaces of the substrate 26 and of the substrate holder.

The illumination source of the lithography system can be a light source such as, for example, a mercury g-line source (436 nm) or i-line source (365 nm), a KrF excimer laser (248 nm), an ArF excimer laser (193 nm) or a $F_2$ laser (157 nm). The projection system 14 projects and/or focuses the light passing through the reticle onto the substrate 26. Depending upon the design of the exposure apparatus, the projection system 14 can magnify or reduce the image illuminated on the reticle. It also could be a 1× magnification system.

When far ultraviolet radiation such as from the excimer laser is used, glass materials such as silica glass and calcium fluoride that transmit far ultraviolet rays can be used in the projection system 14. The projection system 14 can be a catadioptric, completely refractive or completely reflective.

With an exposure device, use of the catadioptric type optical system can be considered. Examples of the catadioptric type of optical system are shown in U.S. Pat. Nos. 5,668,672 and 5,835,275. In these cases, the reflecting optical device can be a catadioptric optical system incorporating a beam splitter and concave mirror. U.S. Pat. No. 5,689,377 also uses a reflective-refracting type of optical system incorporating a concave mirror, etc., but without a beam splitter, and also can be employed with this invention. The disclosures of the above-mentioned U.S. patents are incorporated herein by reference in their entireties.

Figure 2:
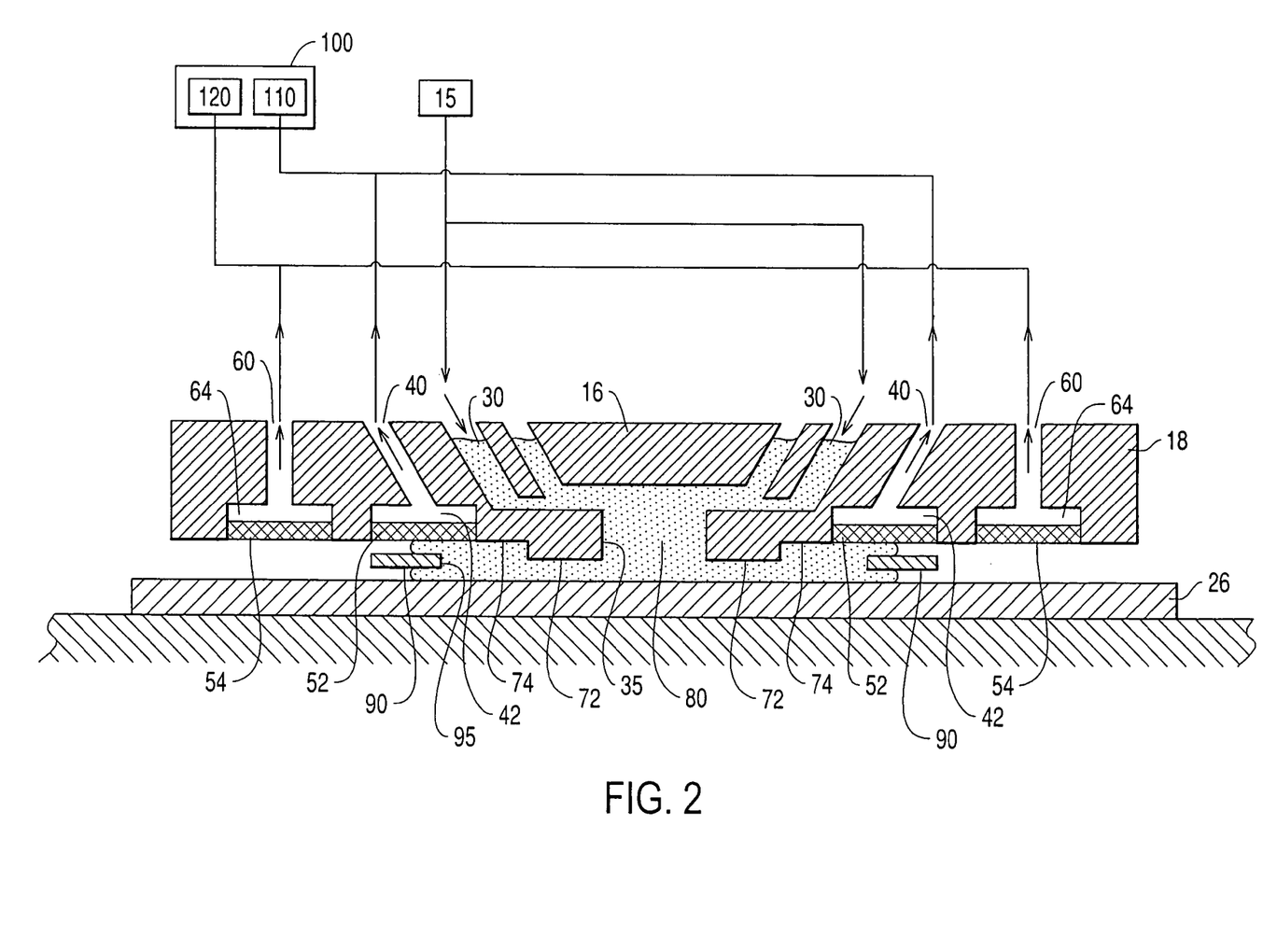
FIG. 2 is a cross-section view of a liquid confinement member maintaining immersion liquid between a substrate and a final optical element, and including a liquid diverter according to one embodiment of the invention.

FIG. 2 is a cross-section view of an embodiment of a liquid confinement member 18. As shown in FIG. 2, the liquid confinement member 18 maintains immersion liquid 80 in an immersion area, which includes the gap or space between the final optical element 16 of the projection system 14 and a portion of the upper surface of the substrate 26. The immersion liquid 80 in FIG. 2 can be seen as occupying only a portion of the upper surface of the substrate 26. That is, the size of the immersion area is smaller than the size of the upper surface of the substrate 26 such that only part of the upper surface of the substrate is covered. Depending on the relative position of the substrate 26 with respect to the projection system 14 (and the liquid confinement member 18) the immersion area can be disposed over the substrate, over a portion of the substrate and a portion of the substrate holder that surrounds the substrate, or over only a portion of the substrate holder (for example, when the substrate is moved such that it no longer is disposed below the projection system 14). In addition, if the exposure apparatus includes a measurement stage that is used to take measurements regarding the projection system 14, the immersion area can be formed between an upper surface of the measurement stage and the final optical element 16 (there would be no substrate holder on the measurement stage).

The liquid confinement member 18 includes at least one (and preferably more than one) liquid supply inlets 30 through which the immersion liquid 80 is supplied to the immersion area. The liquid is supplied to the supply inlets 30 through a supply path, one end of which is connected to a liquid supply 15 and the other end of which is connected to an inlet manifold of the liquid confinement member 18. The liquid supplied to the supply inlets 30 reaches the substrate 26 after passing through aperture 35 disposed centrally in the confinement member 18. As shown in FIG. 2, the supply and recovery of the immersion liquid is controlled so that the level of the immersion liquid between the liquid confinement member 18 and the final optical element 16 is maintained above the lower surface of the final optical element 16 so that the exposure light transmitted through the projection system 14 travels only through the immersion liquid (that is, the exposure light does not travel through any air or gas) before reaching the substrate 26.

In the FIG. 2 embodiment, the liquid confinement member 18 includes a first set of liquid outlets 40 and a second set of liquid outlets 60. The first set of liquid outlets 40 communicates with a first fluid recovery chamber 42 that, according to some embodiments, surrounds the aperture 35. The second set of liquid outlets 60 communicates with a second fluid recovery chamber 64 that surrounds the first fluid recovery chamber 42. The first fluid recovery chamber 42 thus is located closer to the aperture 35 or the center of the immersion area (which, in the FIG. 2 embodiment, corresponds to the optical axis of the projection system 14) than is the second fluid recovery chamber 64. The first fluid recovery chamber 42 is covered by a first porous member 52. The second fluid recovery chamber 64 is covered by a second porous member 54.

Figure 3:
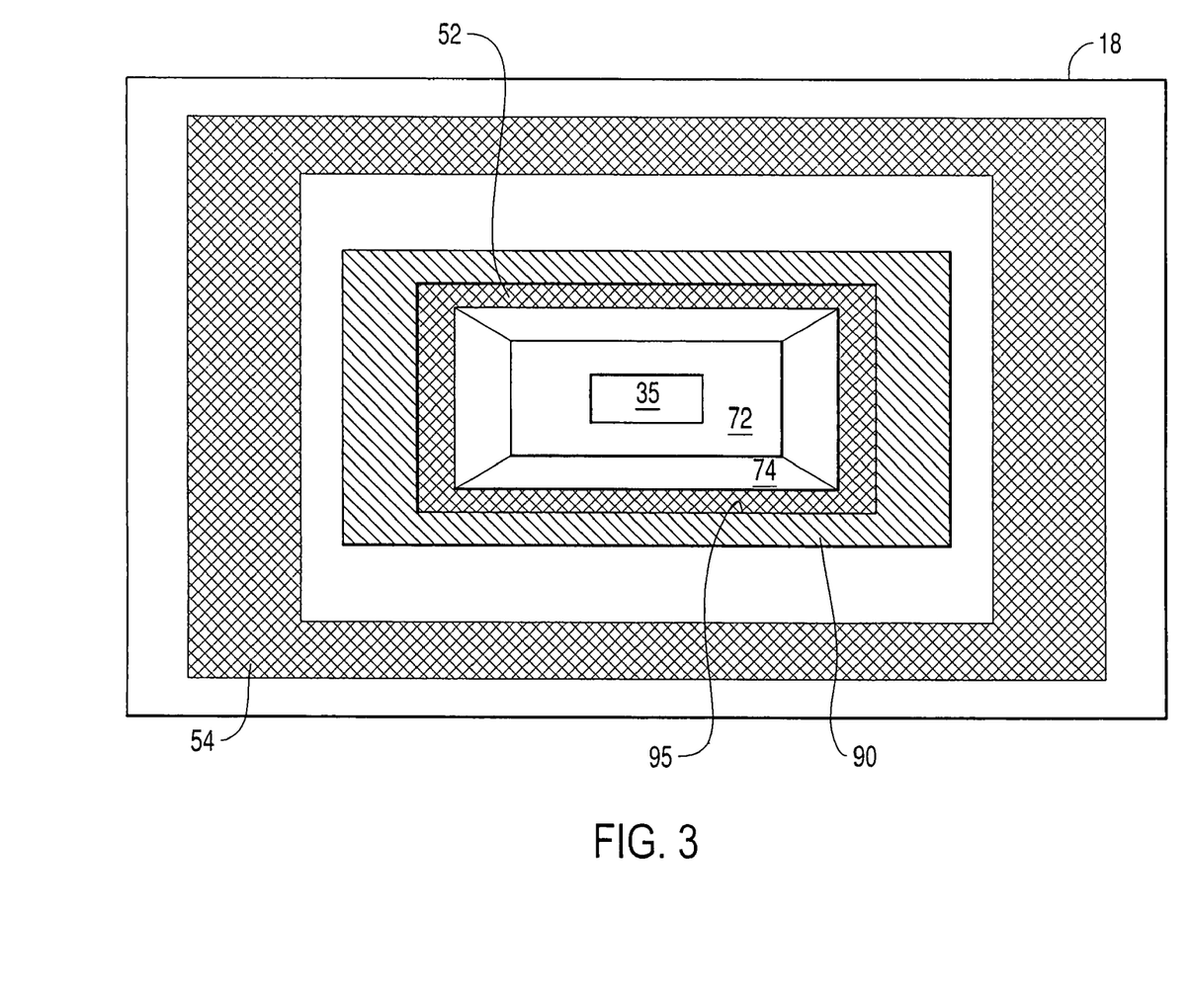
FIG. 3 is a plan view showing the lower surface of the FIG. 2 liquid confinement member with the liquid diverter partially overlapping a first, higher suction porous member.

As can be seen from FIG. 3, which shows a lower surface of the liquid confinement member 18, the first porous member 52 (and its covered fluid recovery chamber 42) completely surrounds the aperture 35 in the liquid confinement member 18. In addition, the second porous member 54 (and its covered fluid recovery chamber 64) completely surrounds the first porous member 52 (and its fluid recovery chamber 42).

A first higher suction force is applied through the first porous member 52 than is applied through the second porous member 54. As such, most of the immersion liquid that escapes the immersion area is collected through the first porous member 52 and its fluid recovery chamber 42. Any immersion liquid that is not recovered through the first porous member 52 and that escapes from the immersion area is recovered through the second, outer porous member 54 and its fluid recovery chamber 64. The lower suction force porous member 54 is very effective at removing droplets and other small quantities of liquid.

The difference in suction forces provided through the first and second porous members 52 and 54 can be achieved in different ways. For example, if the structures of the first and second porous members 52 and 54 are identical, a higher suction force (higher vacuum level) can be applied to the first fluid recovery chamber 42 via liquid outlets 40 than is applied to the second fluid recovery chamber 64 through liquid outlets 60. As shown in FIG. 2, a fluid recovery control system 100 controls the vacuum pressures that are applied to the first and second liquid outlets 40 and 60. In particular, a first, high vacuum supply system 110 applies a first, relatively high vacuum force to the liquid outlets 40, whereas a second weaker vacuum supply system 120 applies a weaker vacuum force to the liquid outlets 60. It is highly desirable and preferable that the vacuum forces applied to the liquid outlets 40 and 60 are maintained below the bubble point of the first and second porous members 52 and 54 so that gas is not suctioned through the porous members 52 and 54. Suctioning of gas through the porous members causes vibration of the liquid confinement member 18, which is not desirable. Systems for controlling the vacuum force that is applied through porous members used to collect liquid from a substrate in an immersion exposure apparatus are described, for example, in US2006/0152697 and US2007/0222967, the disclosures of which are incorporated herein by reference in their entireties.

Another way of providing different suction forces through the first and second porous members 52 and 54 is to make the structures of the first and second porous members 52 and 54 different from each other such that the porous members 52 and 54 provide different resistances to flow therethrough. In this case, the same vacuum force can be applied to both porous portions. In particular, by designing the first porous member 52 so as to have less resistance to flow therethrough as compared to the second porous member 54, a higher suction force will be applied through the first porous member 52 than through the second porous member 54 even when the same vacuum level is provided to the liquid outlets 40 and 60. This can be accomplished, for example, by providing larger pores in the first porous member 52 as compared to the second porous member 54, or by making the second porous member 54 thicker than the first porous member 52, or by providing different pore sizes and thicknesses. Varying the number of pores per given area also will affect the porous member's resistance to through-flow. In general, each porous member 52, 54 can be a mesh, a porous material such as a sponge or a member having holes etched therein. The member can be, for example, glass, metal, ceramics or plastic. See, for example, US2007/0046910, the disclosure of which is incorporated herein by reference in its entirety. The porous member also can be a porous ceramic, sintered glass, chemically etched metal sheets, etc.

The pore size of the pores in the porous members preferably is about 5 μm to 125 μm. Smaller pore sizes are preferred because a smaller pore size increases the bubble point of the porous member, which, in turn, reduces the chances of gas being sucked through the porous members.

FIG. 2 also illustrates a liquid diverter 90 disposed between the substrate 26 and the inner porous member 52. As shown in FIG. 3, the liquid diverter 90 surrounds the aperture 35 of the liquid confinement member 18 and defines an opening 95. In the illustrated embodiment, the liquid diverter is a single plate having an opening 95. However, the liquid diverter could be defined by a plurality of plates that collectively form the opening 95 by surrounding the aperture 35. For example, four separate plate members could be provided, one on each side of the rectangular aperture 35. In the FIG. 2 embodiment, the liquid diverter 90 is flat and parallel to the upper surface of substrate 26 and parallel to the lower surface of porous member 52. However, the liquid diverter 90 could be slanted such that its inner side (the side closest to the projection system optical axis) is located closer to the substrate 26 than its outer side (its side located farthest from the projection system optical axis). Slanting the liquid diverter 90 will further facilitate directing the immersion liquid to the porous member 52.

The liquid diverter 90 also could be a series of concentric plate members as disclosed in US2008/0231822, the disclosure of which is incorporated herein by reference in its entirety.

It is not necessary to dispose the liquid diverter between the first, inner porous member 52 and the substrate 26. The liquid diverter also could be disposed between the second, outer porous member 54 and the substrate 26.

The liquid diverter can be attached to the liquid confinement member 18 or can be supported separate from the liquid confinement member 18.

Figure 4:
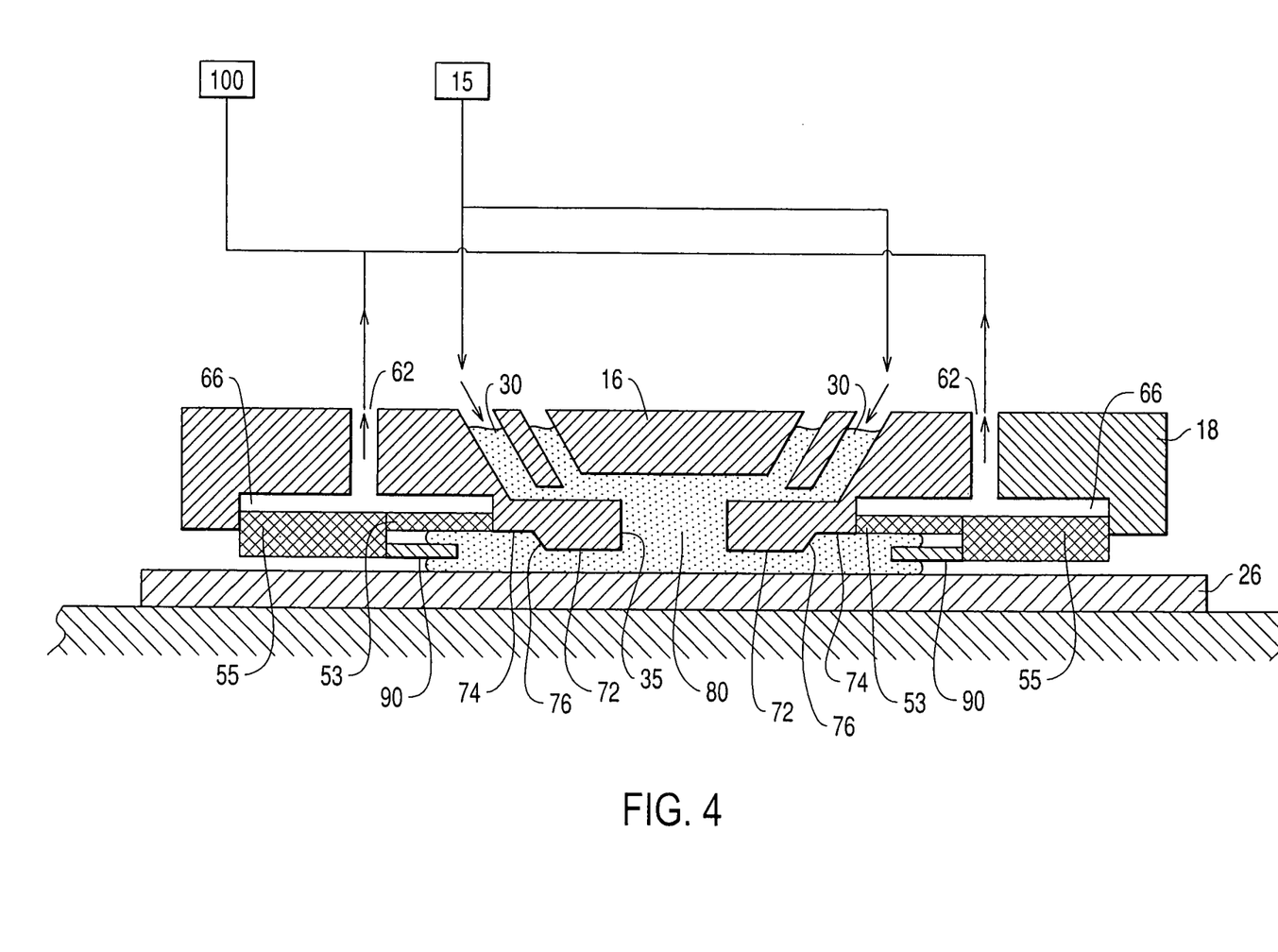
FIG. 4 is cross-section view of a liquid confinement member maintaining immersion liquid between a substrate and a final optical element and including a liquid diverter according to another embodiment of the invention.

FIG. 4 shows a second embodiment in which a single fluid recovery chamber 66 having liquid outlets 62 is provided. In the FIG. 4 embodiment, the fluid recovery chamber 66 has its inner portion (the portion closest to the projection system optical axis) covered by a first porous member 53 and has its outer portion (the portion farthest from the projection system optical axis) covered by a second porous member 55. In the FIG. 4 embodiment, the outer, second porous member 55 is thicker than the inner, first porous member 53 and has the liquid diverter 90 projecting inwardly (toward the optical axis) from the outer, second porous member 55. In addition, porous member 53 has more pores per unit area than porous member 55. In the FIG. 4 embodiment, a single low pressure is applied from control system 100 to the liquid outlets 62. However, because the first porous member 53 has a lower resistance to flow than the second porous member 55, a higher suction force will be applied through the first porous member 53 than through the second porous member 55. In one embodiment, the first porous member 53 has a pore size ranging from 5 to 200 μm and is made as thin as possible, while the second porous member 55 has a pore size ranging from 1 to 200 μm and a thickness ranging from 100 to 10,000 μm. According to one embodiment, the porous members 53 and 55 and the diverter 90 are fabricated from a single metal plate.

Another aspect of the invention relates to the portion of the liquid confinement member 18 that surrounds the aperture 35 and is disposed between the aperture 35 and the first porous member (52 in FIG. 2 embodiment and 53 in the FIG. 4 embodiment). This portion of the liquid confinement member 18 is referred to as a non-fluid recovery portion and is used to form and control the immersion area on the substrate 26. As shown in the embodiments of FIGS. 2 and 4, the non-fluid recovery portion includes an innermost portion 72 (closest to the optical axis) that is located a first distance from the upper surface of substrate 26, and includes an outer portion 74 (farthest from the optical axis) that is located a second distance from the upper surface of substrate 26, the second distance being larger than the first distance. Providing this two-leveled non-fluid recovery portion helps to center the immersion area under the final optical element 16. In particular, it is desirable to provide the surface 72 that is close to the upper surface of the substrate 26 in order to reduce the amount of liquid flow that is required to keep the exposure area free of bubbles during normal operation. In this regard, the surface 72 is sometimes called a "choke plate." Providing the surface 74 outward of the choke plate 72 increases the size of the gap between the substrate 26 and the region outside of the choke plate 72. This has the effect of increasing the volume that the liquid must fill in the region outside of the choke plate and keeps the immersion area closer to the center of the confinement plate 18.

Figure 5A:
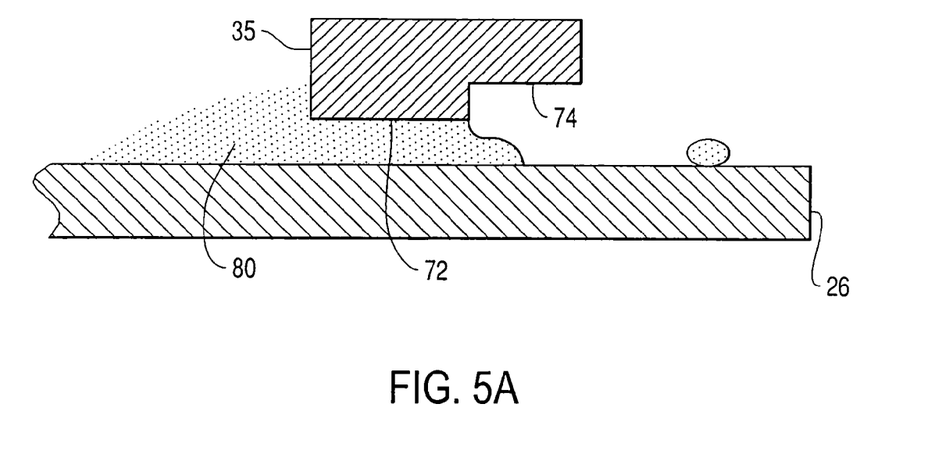
FIG. 5A shows a step transition between surfaces in a non-fluid recovery portion of the liquid confinement member.
Figure 5B:
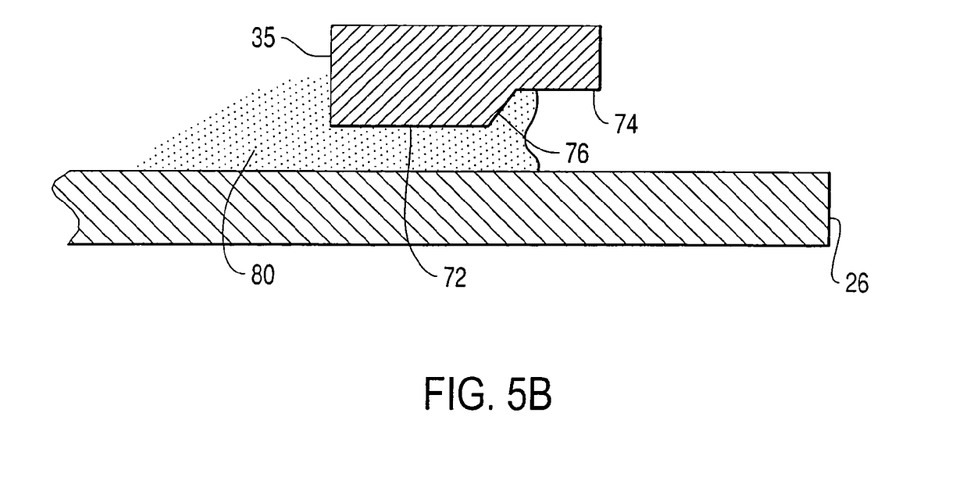
FIG. 5B shows a tapered transition between surfaces in a non-fluid recovery portion of the liquid confinement member.

According to the FIG. 2 embodiment, the transition from surface 72 to surface 74 is a step. However, as shown in FIG. 4, it is preferable for the transition between surface 72 and surface 74 to be a tapered surface 76. The tapered (or chamfered) surface 76 allows the meniscus of the immersion area to more freely pass the transition between surfaces 72 and 74 during substrate movement without causing portions of the immersion area to break off and form droplets. FIG. 5A shows how droplets can break off with a step transition, whereas FIG. 5B shows how liquid more smoothly flows past the tapered surface 76. The tapered transition also assists in directing liquid to the first porous member 52 or 53.

Figure 6:
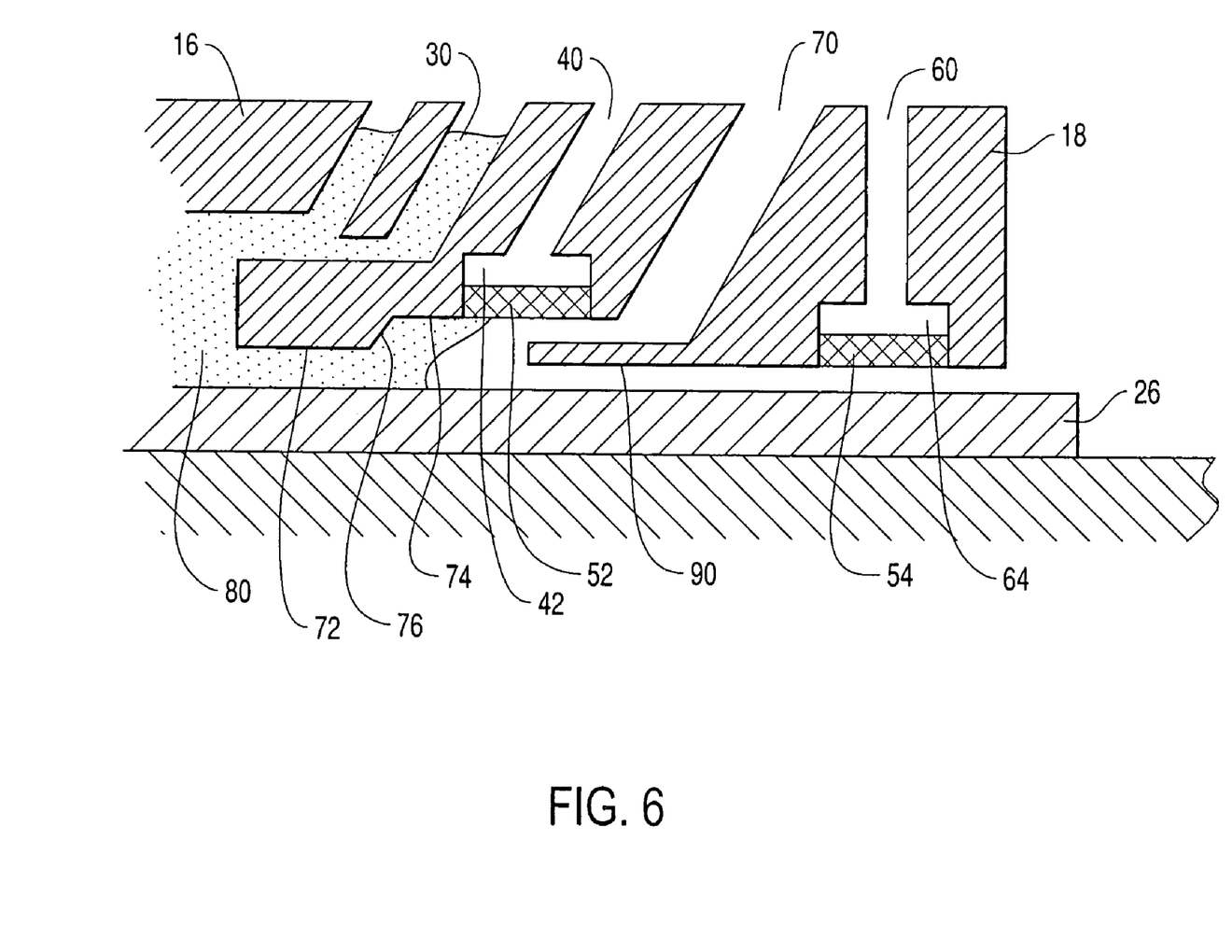
FIG. 6 shows another liquid confinement member embodiment that includes a vent.

FIG. 6 shows another embodiment of a liquid confinement member 18. In FIG. 6, components similar to components of the previously-described embodiments are designated with the same reference numerals and will not be further described. The FIG. 6 embodiment includes a vent passage 70 outward of the first porous member 52. The vent passage 70 permits gas to rapidly leave the gap between the substrate 26 and the liquid confinement member 18, for example, when liquid is initially supplied to the supply inlets 30. The liquid diverter 90 extends over the lower opening of the vent passage 70 and at least partially overlaps the first porous member 52. FIG. 6 also shows how the tapered surface 76 directs liquid to the surface 74 and toward the first porous member 52.

In certain embodiments, the immersion fluid is a liquid having a high index of refraction. In different embodiments, the liquid may be pure water, or a liquid including, but not limited to, cedar oil, fluorin-based oils, "Decalin" or "Perhydropyrene."

The porous members 52, 53, 54 and 55 may be a mesh or may be formed of a porous material having holes typically with a size smaller than 150 μm. For example, the porous member may be a wire mesh including woven pieces or layers of material made of metal, plastic or the like, a porous metal, a porous glass, a porous plastic, a porous ceramic, or a sheet of material having chemically etched holes (for example, by photo-etching).

The use of the exposure apparatus described herein is not limited to a photolithography system for semiconductor manufacturing. The exposure apparatus, for example, can be used as an LCD photolithography system that exposes a liquid crystal display device pattern onto a rectangular glass plate, or a photolithography system for manufacturing a thin film magnetic head.

Figure 7:
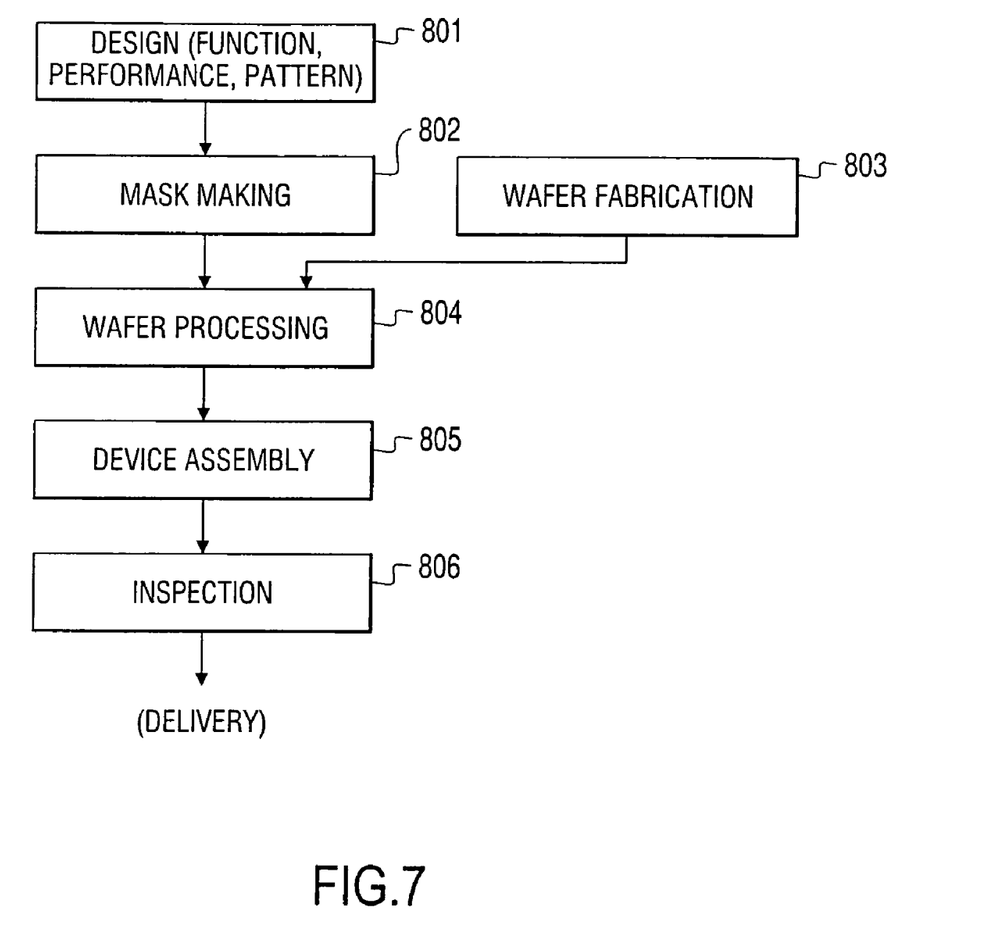
FIG. 7 is a flowchart that outlines a process for manufacturing a device in accordance with the invention.

Semiconductor devices can be fabricated using the above described systems, by the process shown generally in FIG. 7. In step 801 the device's function and performance characteristics are designed. Next, in step 802, a mask (reticle) having a pattern is designed according to the previous designing step, and in a step 803, a wafer is made from a silicon material. The mask pattern designed in step 802 is exposed onto the wafer from step 803 in step 804 by a photolithography system described hereinabove in accordance with aspects of the invention. In step 805, the semiconductor device is assembled (including the dicing process, bonding process and packaging process). Finally, the device is then inspected in step 806.

Figure 8:
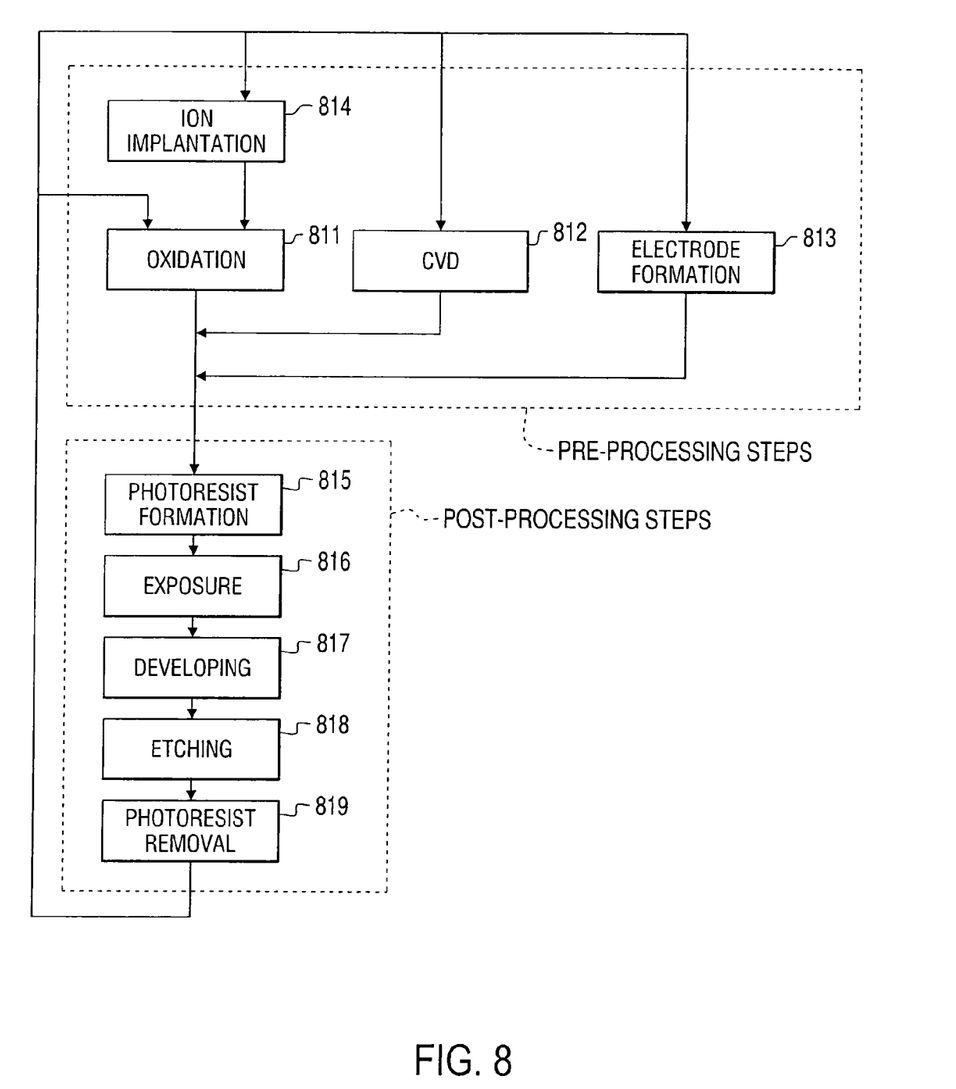
FIG. 8 is a flowchart that outlines device processing in more detail.

FIG. 8 illustrates a detailed flowchart example of the above-mentioned step 804 in the case of fabricating semiconductor devices. In FIG. 8, in step 811 (oxidation step), the wafer surface is oxidized. In step 812 (CVD step), an insulation film is formed on the wafer surface. In step 813 (electrode formation step), electrodes are formed on the wafer by vapor deposition. In step 814 (ion implantation step), ions are implanted in the wafer. The above mentioned steps 811-814 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 815 (photoresist formation step), photoresist is applied to a wafer. Next, in step 816 (exposure step), the above-mentioned exposure device is used to transfer the circuit pattern of a mask (reticle) to a wafer. Then in step 817 (developing step), the exposed wafer is developed, and in step 818 (etching step), parts other than residual photoresist (exposed material surface) are removed by etching. In step 819 (photoresist removal step), unnecessary photoresist remaining after etching is removed. Multiple circuit patterns are formed by repetition of these preprocessing and post-processing steps.

A photolithography system (an exposure apparatus) according to the embodiments described herein can be built by assembling various subsystems in such a manner that prescribed mechanical accuracy, electrical accuracy, and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes providing mechanical interfaces, electrical circuit wiring connections and air pressure plumbing connections between each subsystem. Each subsystem also is assembled prior to assembling a photolithography system from the various subsystems. Once a photolithography system is assembled using the various subsystems, a total adjustment is performed to make sure that accuracy is maintained in the complete photolithography system. Additionally, it is desirable to manufacture an exposure system in a clean room where the temperature and cleanliness are controlled.

While the invention has been described with reference to preferred embodiments thereof, it is to be understood that the invention is not limited to the preferred embodiments or constructions. The invention is intended to cover various modifications and equivalent arrangements. In addition, while the various elements of the preferred embodiments are shown in various combinations and configurations, that are exemplary, other combinations and configurations, including more, less or only a single element, are also within the spirit and scope of the invention.

What is claimed is:

1. An immersion lithography apparatus comprising:
   a projection system having a final optical element;
   a movable stage that is movable to a position below the projection system such that a gap exists between the final optical element and a surface of the stage, an immersion liquid being filled in the gap between the surface and the final optical element;
   a liquid confinement member that maintains the immersion liquid in the gap between the surface and the final optical element, the liquid confinement member including a liquid recovery portion that faces the surface of the stage and that recovers liquid from the gap, the liquid recovery portion including a porous portion, the porous portion including a first porous portion through which a first suction force is applied and a second porous portion through which a second suction force less than the first suction force is applied, the second porous portion being farther away from an optical axis of the projection system than is the first porous portion; and
   a liquid diverter positioned between the stage and at least the first porous portion of the liquid confinement member.

2. The apparatus of claim 1, wherein the liquid diverter includes a plate having an opening that surrounds the optical axis.

3. The apparatus of claim 1, wherein the liquid diverter includes a plurality of plates that collectively define an opening that surrounds the optical axis.

4. The apparatus of claim 1, wherein the liquid confinement member includes an aperture through which an image projected by the projection system passes to reach a target imaging area, an opening defined by the liquid diverter surrounding the optical axis and being larger than the aperture.

5. The apparatus of claim 1, wherein the first and second porous portions are spaced from each other with respect to a direction extending away from the optical axis.

6. The apparatus of claim 5, wherein the first porous portion covers a first fluid recovery chamber, and the second porous portion covers a second fluid recovery chamber that is separate from the first fluid recovery chamber.

7. The apparatus of claim 6, wherein a first vacuum pressure is applied to the first fluid recovery chamber, and a second vacuum pressure, weaker than the first vacuum pressure, is applied to the second fluid recovery chamber.

8. The apparatus of claim 1, wherein the first and second porous portions differ in at least one of pore size, thickness and porosity.

9. The apparatus of claim 1, wherein the first and second porous portions abut each other.

10. The apparatus of claim 9, wherein the first and second porous portions cover a fluid recovery chamber.

11. The apparatus of claim 10, wherein the first and second porous portions differ in at least one of pore size, thickness and porosity.

12. The apparatus of claim 1, wherein the liquid confinement member substantially surrounds the final optical element of the projection system and includes an aperture.

13. The apparatus of claim 12, wherein the liquid confinement member includes a non-fluid recovery portion that surrounds the aperture and is disposed between the aperture and the liquid recovery portion with respect to a direction extending away from the optical axis, a first distance between the surface of the stage and a surface of the non-fluid recovery portion being less than a second distance between the surface of the stage and a surface of the liquid recovery portion.

14. The apparatus of claim 13, wherein the non-fluid recovery portion has a first inner portion and a second outer portion, the first inner portion located closer to the optical axis than is the second outer portion, a surface of the first inner portion located the first distance from the surface of the stage, a surface of the second outer portion being located farther than the first distance from the surface of the stage.

15. The apparatus of claim 14, wherein a step is disposed between the first inner portion and the second outer portion.

16. The apparatus of claim 14, wherein a taper is disposed between the first inner portion and the second outer portion.

17. The apparatus of claim 13, wherein an outermost portion of the non-fluid recovery portion is tapered.

18. The apparatus of claim 1, wherein the stage includes a substrate holder, and an upper surface of the substrate holder, an upper surface of a substrate held by the substrate holder, or both, corresponds to the surface between which the gap is formed with the final optical element.

19. A device manufacturing method comprising:
exposing a substrate by projecting a pattern image onto the substrate through an immersion liquid and the projection system of the apparatus of claim 1; and
developing the exposed substrate.

20. An immersion lithography apparatus comprising:
a substrate holder on which a substrate having an imaging surface is held;
a projection system having a final optical element, the projection system projecting an image onto a target imaging area on the imaging surface of the substrate held on the substrate holder through an immersion liquid filled in a gap between the imaging surface of the substrate and the final optical element;
a liquid confinement member that maintains the immersion liquid in the gap between the imaging surface and the final optical element, the liquid confinement member including a liquid recovery portion that faces the imaging surface and that recovers liquid from the gap, the liquid recovery portion including a porous portion, the porous portion including a first porous portion through which a first suction force is applied and a second porous portion through which a second suction force less than the first suction force is applied, the second porous portion being located farther away from the target imaging area than is the first porous portion; and
a liquid diverter plate positioned between the stage and at least the first porous portion of the liquid confinement member.

21. The apparatus of claim 20, wherein the liquid diverter plate has an opening that surrounds the target imaging area.

22. The apparatus of claim 20, wherein the liquid diverter plate includes a plurality of plates that collectively define an opening that surrounds the target imaging area.

23. The apparatus of claim 20, wherein the first and second porous portions are spaced from each other with respect to a direction extending away from the target imaging area.

24. The apparatus of claim 23, wherein the first porous portion covers a first fluid recovery chamber, and the second porous portion covers a second fluid recovery chamber that is separate from the first fluid recovery chamber.

25. The apparatus of claim 24, wherein a first vacuum pressure is applied to the first fluid recovery chamber, and a second vacuum pressure, weaker than the first vacuum pressure, is applied to the second fluid recovery chamber.

26. The apparatus of claim 20, wherein the first and second porous portions differ in at least one of pore size, thickness and porosity.

27. The apparatus of claim 20, wherein the first and second porous portions abut each other.

28. The apparatus of claim 27, wherein the first and second porous portions cover a fluid recovery chamber.

29. The apparatus of claim 28, wherein the first and second porous portions differ in at least one of pore size, thickness and porosity.

30. The apparatus of claim 20, wherein the liquid confinement member substantially surrounds the final optical element of the projection system and includes an aperture.

31. The apparatus of claim 30, wherein the liquid confinement member includes a non-fluid recovery portion that surrounds the aperture and is disposed between the aperture and the liquid recovery portion with respect to a direction extending away from the target imaging area, a first distance between the imaging surface of the substrate and a surface of the non-fluid recovery portion being less than a second distance between the imaging surface of the substrate and a surface of the liquid recovery portion.

32. The apparatus of claim 31, wherein the non-fluid recovery portion has a first inner portion and a second outer portion, the first inner portion located closer to the target imaging area than is the second outer portion, a surface of the first inner portion located the first distance from the imaging surface of the substrate, a surface of the second outer portion being located farther than the first distance from the imaging surface of the substrate.

33. The apparatus of claim 32, wherein a step is disposed between the first inner portion and the second outer portion.

34. The apparatus of claim 32, wherein a taper is disposed between the first inner portion and the second outer portion.

35. The apparatus of claim 31, wherein an outermost portion of the non-fluid recovery portion is tapered.

36. A device manufacturing method comprising:
exposing a substrate by projecting a pattern image onto the substrate through an immersion liquid and the projection system of the apparatus of claim 20; and
developing the exposed substrate.

* * * * *